United States Patent [19]

Fujii

[11] Patent Number: 5,345,116
[45] Date of Patent: Sep. 6, 1994

[54] IIL CIRCUIT AND INTEGRATED CIRCUIT HAVING THE SAME

[75] Inventor: Norio Fujii, Kyoto, Japan

[73] Assignee: Rohm Co., Ltd., Kyoto, Japan

[21] Appl. No.: 86,202

[22] Filed: Jul. 6, 1993

[51] Int. Cl.[5] .................................. H03K 19/091
[52] U.S. Cl. ..................... 307/477; 307/459
[58] Field of Search ........... 307/443, 459, 477, 296.6; 257/555

[56] References Cited

U.S. PATENT DOCUMENTS

| 4,326,135 | 4/1982 | Jarrett et al. | 307/477 X |
|---|---|---|---|
| 4,438,353 | 3/1984 | Sano et al. | 307/459 X |
| 4,543,499 | 9/1985 | Kaneko et al. | 307/477 |

Primary Examiner—David R. Hudspeth
Attorney, Agent, or Firm—Fay, Sharpe, Beall, Fagan, Minnich & McKee

[57] ABSTRACT

An IIL circuit includes a current mirror circuit that receives a constant current as an incoming signal and which inverts and amplifies the constant current to produce an outgoing inverted current. The current mirror circuit adds the incoming constant current to the inverted current and supplies the sum of those currents as an injector current to the respective injectors of a plurality of IIL gates.

3 Claims, 1 Drawing Sheet

IIL CIRCUIT AND INTEGRATED CIRCUIT HAVING THE SAME

DESCRIPTION

Technical Field

This invention relates to an IIL (integrated injection logic) circuit and an integrated circuit having the same. More particularly, this invention relates to an IIL circuit having a current supply circuit that requires a lower drive voltage to supply an injector current to an IIL gate portion composed of IIL gates which are logic circuit elements of a bipolar structure.

Background Art

FIG. 2 shows an exemplary conventional IIL circuit composed of a circuit for supplying an IIL injector current and a plurality of IIL gates to be supplied with the injector current. Shown by 1 is the injector current supply circuit, and 2 and 3 each denote an IIL gate. The plurality of IIL gates 2, 3 ... n are NOT gates which are the building blocks of a logic circuit and IIL gates serving as gates other than NOT gates can be composed by combinations of these basic blocks.

The IIL circuit shown in FIG. 2 is operated as follows. When input A to IIL gate 2 is at a high level (hereunder referred to as "H"), the constant current flowing through the so-called "injector" transistor Qa flows to the base of transistor Qb, which then turns on to produce a low level (hereunder referred to as "L") at output B. If, on the other hand, input A is "H", the constant current flowing through transistor Qa will flow to input A. Take, for example, the case where the output of an IIL gate is connected to the input of a subsequent similar IIL gate; according to the above-described theory of an IIL circuit, the transistor on the output side of the second IIL gate will turn on and flow to the input A of the first IIL gate. Thus, the constant current flowing through transistor Qa will flow through its collector-emitter to be supplied into the ground line GND. The current flowing through transistor Qa is no more than about 1 $\mu$A and the level of "H" is about 0.7 volts.

The IIL structure described above provides large-scale integration and a number of IIL gates of this structure are mounted on an IIL-IC. Since IIL gates are of a current-driven type, the current supply circuit 1 supplies a number of IIL gates 2, 3, ... n with an injector current Iinj which is the necessary current for bringing those gates into action.

One or two units of the current supply circuit 1 are usually mounted on an IC for realizing large-scale integration. To this end, the necessary value of injector current Iinj is held to lie within the range from about several to less than a hundred milliamperes. It is also necessary that the sum of the injector currents to be supplied to the respective gates be stable at a constant value.

Under these circumstances, the conventional current supply circuit 1 is such that the logic IC circuit is deliberately equipped with a constant current circuit made of diode-connected transistors Q3–Q5 that can be fabricated easily and which deliver a small current. To produce a reference current Iref, the constant current circuit is supplied with a current from a constant-current source 11. The value of current supplied from the constant-current source 11 has high precision and is in the range between less than a hundred to less than a thousand microamperes. This constant current is amplified by Darlington-connected transistors Q1 and Q2 to generate the injector current Iinj.

In the circuit described above, the injector current Iinj is determined by the amplification factor which is proportional to the resistance ratio between two bias resistors R1 and R2 connected to transistors Q1 and Q2, respectively. In addition, the high precision of reference current Iref contributes to the stabilization of injector current Iinj. As a result, IIL gates 2, 3, ... n are capable of operating in a consistent manner.

Thus, in order to amplify the reference current to produce a constant current that is to be supplied to the gate injector, the conventional IIL injector current supply circuit uses Darlington-connected transistors and determines the amplification factor by means of the associated bias resistors. However, those resistors produce a voltage drop. Another problem is the power consumption by those resistors. Therefore, the conventional injector current supply circuit is not suitable for drive with low voltage.

There are other factors that need to be considered in connection with the design of ICs and they are how to cope with the expected drop in withstand voltage which accompanies the increase in the scale of IC integration and the need to save on the power to be consumed by the battery power source. Under these circumstances, there is a strong need to reduce the line voltage to be supplied to ICs and IIL-IC is by no means an exception. However, the aforementioned conventional current supply circuit is not suitable for drive at low voltage since it experiences an unduly large voltage drop—the voltage drop across the resistors is added to the voltage drop across the amplifying transistors. Furthermore, the voltage to be supplied to IIL gates must be maintained above a certain level in order to bring them into operation.

SUMMARY OF THE INVENTION

An object, therefore, of the present invention is to provide an IIL circuit that is capable of producing a consistent injector current even if the line voltage is low.

Another object of the present invention is to provide an integrated circuit having an IIL circuit that is capable of operation at low line voltage.

These objects of the present invention can be attained by an IIL circuit including a current mirror circuit that receives a constant current as an incoming input signal and which inverts and amplifies said constant current to produce an outgoing inverted current, said current mirror circuit adding said incoming constant current to said inverted current and supplying the sum of those currents as an injector current to the respective injectors of a plurality of IIL gates.

A specific configuration of the current mirror circuit is as follows: it includes a first and a second NPN transistor; their bases are connected together and their emitters are also connected together; the first transistor receives at the collector the reference signal which flows in as an input signal; the received reference signal is inverted and amplified to generate an inverted current at the collector of the second transistor; and the sum current defined above which is delivered from the junction between the emitters of the first and second transistors is sent out as the injector current.

The most important feature of the IIL circuit of the present invention is that it uses not Darlington-connected transistors but a current mirror circuit to produce an injector current to be supplied to IIL gates. With this current mirror circuit, the reference signal applied is inverted and amplified to produce an inverted current and the sum of the two currents is supplied as an injector current. This eliminates the need to provide bias resistors and, hence, there will be no voltage drop that would occur if bias resistors were used. As an additional advantage, all current that flows through the current mirror circuit can be effectively used as an injector current.

Therefore, the current supply circuit will cause a smaller voltage drop and can accordingly be operated with a lower line voltage than in the prior art. In addition, said circuit permits more IIL gates to be operated with the same power consumption.

DESCRIPTION OF THE PREFERRED EMBODIMENT

Figure 1:
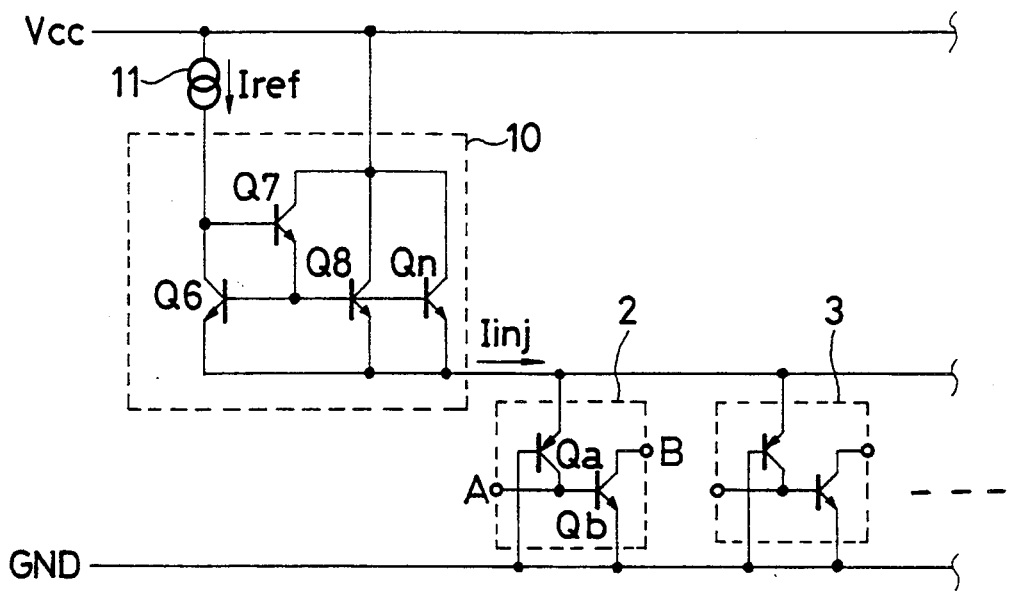
FIG. 1 is a circuit diagram showing an IIL circuit configured according to an embodiment of the present invention.
Figure 2:
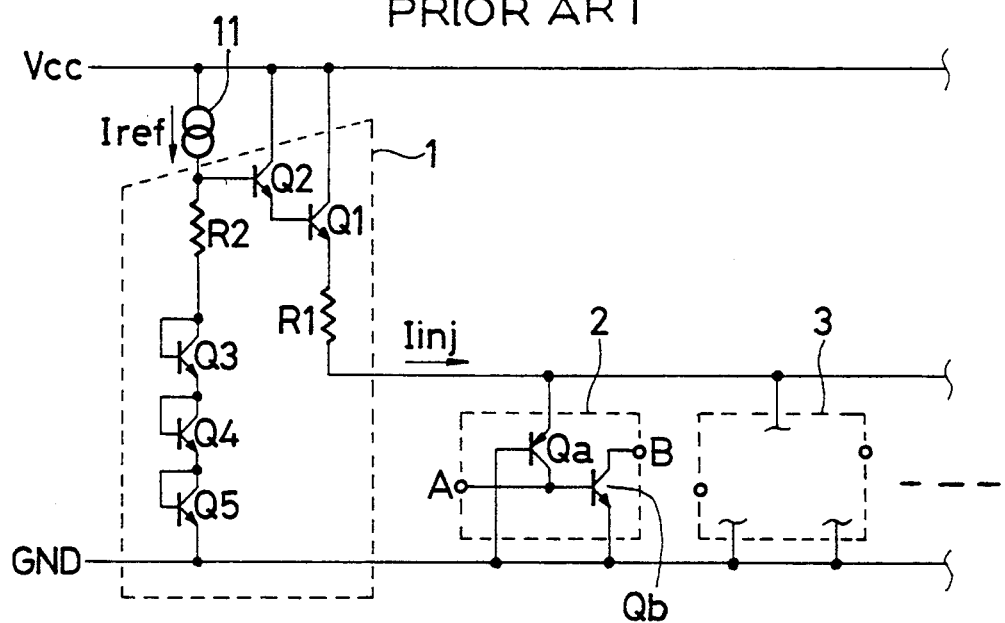
FIG. 2 is a circuit diagram of a conventional IIL circuit.

Referring to FIG. 1, reference numeral 10 denotes an injector current supply circuit, and 2 and 3 are each an IIL gate. Since IIL gates 2 and 3 are identical to those shown in FIG. 2, they need not be described in detail.

The current supply circuit 10 is a current mirror circuit that is chiefly composed of an NPN transistor Q6 on the input side and NPN transistors Q8–Qn that are parallel-connected on the output side. Transistors Q6 and Q8–Qn are such that not only their bases but also their emitters are connected together. Transistor Q6 receives at the collector a reference current Iref from a constant-current source 11 whereas transistors Q8–Qn are such that their collectors connected together are also connected to a power line Vcc. Hence, a current equal to the inverted and amplified Iref is supplied from the power line Vcc. In FIG. 1, only transistors Q8 and Qn are shown as representative examples of amplifying transistors but, in practice, a much greater number of transistors are connected in parallel to provide an enhanced amplifying capability.

To supply an adequate amount of base current to the large number of transistors Q8–Qn, the current mirror circuit includes an NPN transistor Q7 for providing an additional amount of base current. The base and emitter of transistor Q7 are connected to the collector and base, respectively, of transistor Q6, and the collector of transistor Q7 is connected to the collector of transistor Q8.

In the current mirror circuit under discussion, the reference current Iref is inverted and amplified to produce an inverted current, which is combined with the reference current Iref flowing into the current supply circuit 10 and the sum of the two currents is sent out as an injector current Iinj to each of IIL gates 2, 3, ... n. In this case, the current amplification factor is determined by the ratio between the current drive capabilities of transistor Q6 and transistors Q8–Qn. In other words, the amplification factor with two transistors is determined by the ratio of the emitter area of one transistor to that of the other.

In the fabrication process of transistors in ICs, high precision can be attained easily as regards the area ratio between any two devices. According to the present invention, the reference current Iref is amplified with the correct factor to produce the correct inverted current and, hence, the injector current Iinj which is the sum of the reference current and the inverted current also assumes a stable value, thereby contributing to the supply of a greater amount of injector current. Furthermore, the current mirror circuit achieves this without requiring any bias resistors. In other words, the voltage drop that occurs in transistors Q7 and Q8 is the only voltage drop that develops when the injector current Iinj is generated.

As a consequence, even if the value of voltage to be supplied from the power line Vcc is lowered by an amount equal to the voltage drop that has heretofore occurred in the prior art circuit on account of bias resistors, an adequate amount of injector current IinJ can be supplied to each of IIL gates 2, 3, . . . n.

What is claimed is:

1. In an ILL circuit that amplifies a predetermined constant current to produce an injector current which is then supplied to a plurality of IIL gates, the improvement including a current mirror circuit that receives said constant current as an incoming input signal and which inverts and amplifies said constant current to produce an outgoing inverted current, said current mirror circuit adding said incoming constant current to said inverted current and supplying the sum of those currents as said injector current, wherein said current mirror circuit has the injectors of said respective IIL gates connected at a common junction downstream of said current mirror circuit, and wherein said current mirror circuit includes an NPN transistor on the input side that receives said constant current at the collector and a plurality of NPN transistors on the output side that are connected in parallel, said transistors on the output side having their collectors connected to a power line whereas their emitters are connected at a common junction to the emitter of said transistor on the input side, said emitters connected at the common junction being connected to said injectors.

2. An IIL circuit according to claim 1 which includes an NPN transistor the emitter of which is connected to the base of said NPN transistor on the input side, the base of which is connected tot he collector of said NPN transistor on the input side, and the collector of which is connected to the collectors of said transistors on the output side.

3. An integrated circuit having an IIL circuit that comprises:

a plurality of IIL gates;

a constant-current source; and a current mirror circuit that receives a constant current from said constant-current source as an incoming input signal and which inverts and amplifies said constant current to produce an outgoing inverted current, said current mirror circuit adding said incoming constant current to said inverted current and supplying the sum of those currents as an injector current to said plurality of IIL gates, wherein said current mirror circuit includes an NPN transistor on the input side that receives said constant current at the collector and a plurality of NPN transistors on the output side that are connected in parallel, said transistors on the output side having their collectors connected to a power line whereas their emitters are connected at a common junction to the emitter of said transistor on the input side, said emitters connected at the common junction being connected to said injectors.

* * * * *